US009184706B2

(12) United States Patent
Shibuya et al.

(10) Patent No.: US 9,184,706 B2
(45) Date of Patent: Nov. 10, 2015

(54) HIGH-FREQUENCY AMPLIFIER

(71) Applicant: TDK CORPORATION, Tokyo (JP)

(72) Inventors: Tomohiko Shibuya, Tokyo (JP); Atsushi Ajioka, Tokyo (JP); Sadaharu Yoneda, Tokyo (JP); Atsushi Tsumita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 31 days.

(21) Appl. No.: 14/150,219

(22) Filed: Jan. 8, 2014

(65) Prior Publication Data

US 2014/0210556 A1    Jul. 31, 2014

(30) Foreign Application Priority Data

Jan. 29, 2013  (JP) .................................. 2013-014339
Dec. 10, 2013  (JP) .................................. 2013-254789

(51) Int. Cl.
  *H03G 3/20*     (2006.01)
  *H03F 3/193*    (2006.01)
  *H03F 1/02*     (2006.01)

(52) U.S. Cl.
  CPC .............. *H03F 3/193* (2013.01); *H03F 1/0266* (2013.01); *H03F 2200/408* (2013.01)

(58) Field of Classification Search
  CPC ............... H03G 3/20; H03G 3/30; H03F 3/20
  USPC .................................... 330/136, 129, 285, 296
  See application file for complete search history.

(56) References Cited

U.S. PATENT DOCUMENTS 4,465,980 A *   8/1984  Huang et al. ................... 330/149
7,498,876 B2 *  3/2009  Peruzzi et al. .................. 330/10
7,835,710 B2 * 11/2010  Sutardja ..................... 455/127.5

FOREIGN PATENT DOCUMENTS

JP    A-9-92785     4/1997
JP    B2-4118229    7/2008

* cited by examiner

*Primary Examiner* — Henry Choe
(74) *Attorney, Agent, or Firm* — Oliff PLC

(57) ABSTRACT

Since a high-frequency signal that is output from a high-frequency oscillator circuit section is detected in a detector circuit and a bias of a negative voltage is supplied from a bias circuit section to the high-frequency amplifier circuit section with a detection voltage that is detected, a negative power supply circuit such as a DC/DC converter or a peripheral circuit is not required, and since a negative bias voltage can be supplied to a high-frequency amplifier circuit, downsizing can be achieved with a low cost.

2 Claims, 2 Drawing Sheets

HIGH-FREQUENCY AMPLIFIER

BACKGROUND

The present invention relates to a high-frequency amplifier that uses a depression-type transistor in which a threshold voltage of the transistor is minus and, particularly, to a high-frequency amplifier that can easily obtain a negative power supply of a bias supply negative voltage of the high-frequency amplifier.

In recent years, in order to transmit a radio signal of a microwave region of 1 GHz or more of a mobile body communication terminal device such as a mobile telephone terminal, a wireless LAN terminal or the like, a high-frequency amplifier is used which employs a depression-type Field Effect Transistor (FET) using gallium arsenide (GaAs) of which an operation speed is faster than that of a bipolar transistor of the related art. In the depression-type FET, since a forward voltage of a gate is as low as approximately 0.7 V, a voltage that turns off a drain current of the FET is set low as 0 V or less (approximately −2 V) in the gate voltage. Thus, in order to turn off the drain current of the depression-type FET, it is necessary for the drain voltage to be 0 V or for the gate voltage to be set to 0 V or less (approximately −2 V). Further, as an example, the high-frequency amplifier is used in the mobile telephone, the wireless LAN system or the like described above, and is used in a transmitting section of a wireless communication device which amplifies and transmits a high-frequency signal, but is not limited to such a wireless communication device.

Thus, in order to obtain a negative voltage of 0 V or less, a power supply circuit generating a negative voltage is required separately from the high-frequency amplifier that is configured of the FET. Further, in the high-frequency amplifier, for example, if the FET configures a source ground amplifier, it is necessary to apply a desired negative voltage in advance that controls the drain current of the high-frequency amplifier in the gate voltage of the FET in the high-frequency amplifier.

A high-frequency amplifier that is configured of a depression-type FET is disclosed in PTL 1 and PTL 2. As disclosed in the Patent Literature, in the related art, as illustrated in FIG. 4, in a high-frequency amplifier 1, a high-frequency signal from a high-frequency oscillator circuit section 2 is amplified in a high-frequency amplifier circuit section 3 that is configured of the depression-type FET and the high-frequency amplifier circuit section 3 is connected to an outside power supply (not illustrated in the view) from a power supply voltage supply terminal 7. In the depression-type FET of the high-frequency amplifier circuit section 3, it is necessary to include a DC/DC converter 10 or a negative power supply circuit (not illustrated) separately through a bias circuit 5 as a bias supply source for applying a negative gate voltage. For example, as illustrated in FIG. 4, if the DC/DC converter 10 is used, the negative voltage is output from a positive voltage that is input from the DC/DC converter 10 and it is necessary to supply a bias of the negative voltage to the gate of the depression-type FET through the bias circuit 5.

CITATION LIST

Patent Literature

[PTL 1] Japanese Unexamined Patent Application Publication No. 9-92785
[PTL 2] Japanese Patent No. 4118229

SUMMARY

However, generally, the DC/DC converter generates a high noise, therefore, electrical characteristics of the high-frequency amplifier are deteriorated because the noise is included when supplying the bias. Thus, some noise measures are necessary. Further, it is necessary to use the DC/DC converter, a peripheral circuit thereof or a negative power supply circuit separately from the high-frequency amplifier. For example, in a case of the DC/DC converter, in order to create the negative voltage, a capacitor of a large capacity of tens μF or an inductor of tens μH for efficiency or balance of a load transient response is required for improving a circuit configuration or a response delay that inverts the voltage to produce the negative voltage. If the circuit for generating the negative voltage is combined, there is a problem that the cost of the high-frequency amplifier increases and an overall size thereof also increases.

The invention is made in view of such a problem of the related art and an object of the invention is to provide a stable high-frequency amplifier that can obtain a bias of a negative voltage in a gate voltage of a FET that is used in the high-frequency amplifier without using a DC/DC converter or a negative power supply circuit separately, and that can have low noise, a low cost and be downsized.

A high-frequency amplifier of a first characteristic according to the invention for achieving the object described above including: a high-frequency oscillator circuit section that generates a high-frequency signal; a high-frequency amplifier circuit section that amplifies and outputs the high-frequency signal; a bias circuit section that supplies a bias to the high-frequency amplifier circuit section; and a detector circuit section that detects the high-frequency signal which is output from the high-frequency oscillator circuit section between the high-frequency oscillator circuit section and the high-frequency amplifier circuit section, and inputs a voltage to the bias circuit section, in which a negative voltage component of the high-frequency signal from a detector circuit is detected, the detection voltage that is detected is supplied to the bias circuit section, and the bias voltage of the bias circuit section that is supplied to the high-frequency amplifier circuit section is a negative bias voltage.

According to the invention having the characteristics described above, the high-frequency amplifier including: the high-frequency oscillator circuit section that generates the high-frequency signal; the high-frequency amplifier circuit section that amplifies and outputs the high-frequency signal; the bias circuit section that supplies the bias to the high-frequency amplifier circuit section; and the detector circuit section that detects the high-frequency signal which is output from the high-frequency oscillator circuit section between the high-frequency oscillator circuit section and the high-frequency amplifier circuit section, and inputs the voltage to the bias circuit section, in which the negative voltage component of the high-frequency signal from the detector circuit is detected, the detection voltage that is detected is supplied to the bias circuit section, and the bias voltage of the bias circuit section that is supplied to the high-frequency amplifier circuit section is the negative bias voltage. Therefore, the high-frequency signal that is output from the high-frequency oscillator circuit section is amplified in the high-frequency amplifier circuit section and is output; the detector circuit section detects the negative voltage component from the high-frequency signal that is output in the high-frequency oscillator circuit section; a negative output voltage that is detected is supplied to the bias circuit section; and a required appropriate negative bias voltage can be supplied to the high-frequency amplifier circuit section by the bias circuit section.

Therefore, since the high-frequency signal that is output from the high-frequency oscillator circuit section is detected in the detector circuit section and the bias of the negative voltage is supplied from the bias circuit section to the high-frequency amplifier circuit section with the detection voltage that is detected, the DC/DC converter for supplying the bias from the outside is not required and it is possible to improve deterioration of electrical characteristics of the high-frequency amplifier circuit section by eliminating influence of a noise by the DC/DC converter. Further, since the negative bias voltage can be supplied to the high-frequency amplifier circuit section without a negative power supply circuit such as the DC/DC converter or a peripheral circuit thereof, it is possible to provide an inexpensive and small high-frequency amplifier without cost for the DC/DC converter or the peripheral circuit thereof or without increasing an overall size thereof.

In the high-frequency amplifier according to the invention for achieving the object described above, a second characteristic is that of a side of the detector circuit section from a branch point between the high-frequency oscillator circuit section and the high-frequency amplifier circuit section is connected to the detector circuit section configured of a detector circuit having impedance higher than input impedance of the high-frequency amplifier circuit section.

According to the invention having the characteristic described above, since the side of the detector circuit section from the branch point between the high-frequency oscillator circuit section and the high-frequency amplifier circuit section is connected to the detector circuit section configured of a detector circuit having impedance higher than input impedance of the high-frequency amplifier circuit section, it is possible to more efficiently detect only the voltage component from the high-frequency signal that is output from the high-frequency oscillator circuit by the detector circuit section.

Therefore, since in the high-frequency signal that is output from the high-frequency oscillator circuit section, only the voltage component is detected by the detector circuit, a ratio of the high-frequency signal that is input to the side of the detector circuit can be less than the high-frequency signal that is input to the high-frequency amplifier circuit section and high efficiency can be achieved because the high-frequency signal is amplified in the high-frequency amplifier circuit section while suppressing deterioration of the high-frequency signal.

In the high-frequency amplifier according to the invention for achieving the object described above, a third characteristic is that a voltage is supplied from a power supply voltage supply terminal to the high-frequency oscillator circuit section and the high-frequency amplifier circuit section, and the high-frequency amplifier circuit section and the power supply voltage supply terminal are connected through an auxiliary circuit for changing timing of supplying the voltage, and are connected so as to control the auxiliary circuit by an output voltage of the detector circuit.

According to the invention of the characteristic described above, the voltage is supplied from a power supply voltage supply terminal to the high-frequency oscillator circuit section and the high-frequency amplifier circuit section, and the high-frequency amplifier circuit section and the power supply voltage supply terminal are connected through the auxiliary circuit for changing the timing of supplying the voltage, and are connected so as to control the auxiliary circuit by the output voltage of the detector circuit. Therefore, if the voltage is supplied from the power supply voltage supply terminal to the high-frequency oscillator circuit section and the high-frequency amplifier circuit section, the high-frequency oscillator section is driven and the high-frequency signal is output and is detected in the detector circuit, and the negative bias voltage is supplied to the high-frequency amplifier circuit section by the bias circuit section. Further, the auxiliary circuit is controlled by the detection voltage and the voltage is supplied from the power supply voltage supply terminal to the high-frequency amplifier circuit section. Further, if the detection voltage is not applied to the auxiliary circuit, the power supply voltage is not supplied from the power supply voltage supply terminal to the high-frequency amplifier circuit section.

Therefore, since the power supply voltage is controlled to be supplied from the power supply voltage supply terminal to the high-frequency amplifier circuit section only if the detection voltage is applied to the auxiliary circuit, excessive power consumption is eliminated in the high-frequency amplifier circuit section and it is possible to achieve high efficiency of power consumption.

In the high-frequency amplifier according to the invention for achieving the object described above, a fourth characteristic is that the high-frequency amplifier further includes a delay circuit between the branch point of the detector circuit section and the bias circuit section, and the auxiliary circuit.

According to the invention of the characteristic described above, since the delay circuit is included between the branch point of the detector circuit section and the bias circuit section, and the auxiliary circuit, if the detection voltage is applied to the auxiliary circuit, delay occurs. Thus, the power supply voltage is supplied to the high-frequency amplifier circuit section and it is possible to supply the power supply voltage from the power supply voltage supply terminal to the high-frequency amplifier circuit section after the bias of the negative voltage is supplied.

Therefore, since the power supply voltage is not supplied from the power supply voltage supply terminal before the bias of the negative voltage is applied to the high-frequency amplifier circuit section, an excessive current does not flow on the high-frequency amplifier circuit section and it is possible to prevent breakdown of the high-frequency amplifier circuit section.

In the high-frequency amplifier of the invention, a DC/DC converter or a negative power supply circuit that are required for supplying the negative bias voltage to the high-frequency amplifier circuit section are not required, low noise, low cost and downsizing can be achieved, and since the voltage is supplied from the outside to the high-frequency amplifier circuit section after the negative bias voltage is supplied, it is possible to achieve the high efficiency or to suppress the electrical breakdown of the high-frequency amplifier circuit section.

DETAILED DESCRIPTION OF EMBODIMENTS

A suitable form for carrying out the invention is described in detail with reference to the drawings. The invention is not intended to be limited by contents described in the following embodiments. Further, one that can be easily assumed by those skilled in the art, one that is substantially the same and one that is in the equivalent range are included in constituent elements described below. Further, the constituent elements described below can be appropriately combined. Further, various omissions, substitutions or changes of the constituent elements can be performed in a range that does not depart from the scope of the invention.

(First Embodiment)

Figure 1:
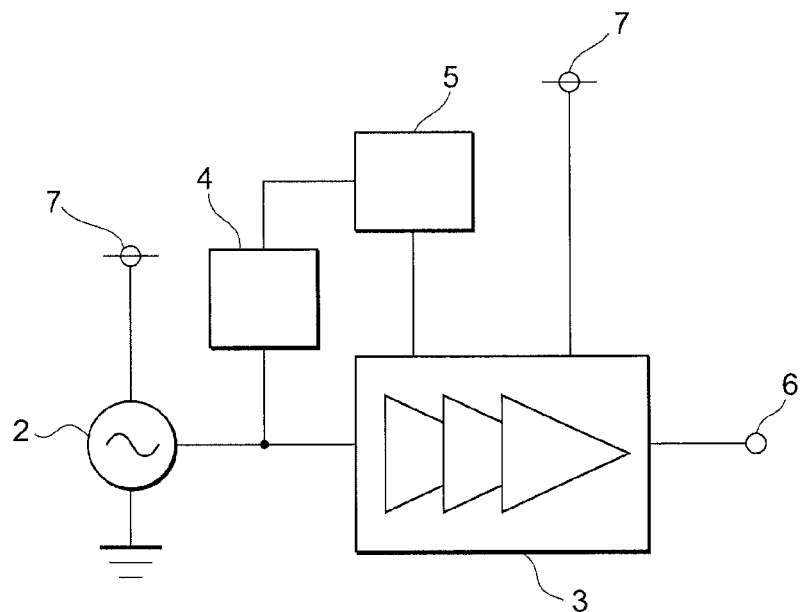
FIG. 1 is a block circuit diagram of a high-frequency amplifier according to a first embodiment.

FIG. 1 is a block diagram illustrating a whole configuration of a general high-frequency amplifier 1 according to a first embodiment. In FIG. 1, in the high-frequency amplifier 1, an output side of a high-frequency oscillator circuit section 2 that generates a high-frequency signal and a high-frequency amplifier circuit section 3 that amplifies the high-frequency signal are connected to the high-frequency amplifier 1, and a detector circuit section 4 is connected through a branch point between the high-frequency oscillator circuit section 2 and the high-frequency amplifier circuit section 3. A bias circuit section 5 for appropriately supplying a bias voltage to the high-frequency amplifier circuit section 3 is connected to an output side of the detector circuit section 4 and the output side of the detector circuit section 4 and a bias supply terminal of the high-frequency amplifier circuit section 3 are connected through the bias circuit section 5. There is an output terminal 6 for outputting the high-frequency signal that is amplified in the output side of the high-frequency amplifier circuit section and there is a power supply voltage supply terminal 7 for performing external power supply of the high-frequency amplifier circuit section 3 in the output side of the high-frequency amplifier circuit section. Further, in order to simplify the description in the invention, a general configuration example of the high-frequency amplifier 1 is illustrated, but the invention can be applied to a block configuration of a high-frequency amplifier other than in the embodiment.

For example, the high-frequency amplifier circuit section 3 is a high-frequency amplifier circuit configured of depression-type FET in parallel in multi stages. Generally, in a case of a source grounded amplifier circuit, a gate of the depression-type FET is connected to a bias supply terminal and an input terminal of the amplifier circuit so that a negative voltage is biased, a drain is connected to a supply terminal of the power supply voltage and an output terminal of the amplifier circuit from the outside, and peripheral parts such as a matching circuit, a choke coil or bypass capacitor may be mounted between each terminal. Further, since the number of gate, a width of the gate, and configuration method of the FET which are used in the high-frequency circuit amplifier section are changed by a specification or a configuration of the high-frequency amplifier 1, they are not specified in the embodiment herein.

Next, an operation is described. First, the high-frequency signal is oscillated and output in the high-frequency oscillator circuit section 2. The high-frequency signal that is output from the high-frequency oscillator circuit section 2 is transmitted to an input of the high-frequency amplifier circuit section 3. For example, since the high-frequency oscillator circuit section 2 may be an oscillator circuit such as a Clapp-type oscillator circuit or a Hartley-type oscillator circuit, if the high-frequency signal is oscillated, they are not specified in the embodiment.

Next, the high-frequency signal that is oscillated in the high-frequency oscillator circuit section 2 is output to the side of the high-frequency amplifier circuit section 3 and the side of the detector circuit section 4 through the branch point between the high-frequency oscillator circuit section 2 and the high-frequency amplifier circuit section 3.

Moreover, the high-frequency signal is detected in the detector circuit section 4 from the branch point between the high-frequency oscillator circuit section 2 and the high-frequency amplifier circuit section 3, and the detector circuit section 4 outputs only a negative voltage component as the detection voltage by configuring the detector circuit section 4 with a circuit configuration for detecting a negative polarity.

Next, the negative detection voltage that is detected in the detector circuit section 4 is applied to the bias circuit section 5 and an appropriate negative bias voltage is supplied to the gate of the FET in the high-frequency amplifier circuit section 3 by the bias circuit section 5.

According to the embodiment, the high-frequency amplifier includes: the high-frequency oscillator circuit section 2 that generates a high-frequency signal; the high-frequency amplifier circuit section 3 that amplifies and outputs the high-frequency signal; the bias circuit section 5 that supplies a bias to the high-frequency amplifier circuit section 3; and the detector circuit section 4 that detects the high-frequency signal which is output from the high-frequency oscillator circuit section 2 between the high-frequency oscillator circuit section 2 and the high-frequency amplifier circuit section 3, and inputs a voltage to the bias circuit section 5, in which only a negative voltage component of the high-frequency signal from the detector circuit section 4 is detected, the detection voltage that is detected is supplied to the bias circuit section 5, and the bias voltage of the bias circuit section 5 that is supplied to the high-frequency amplifier circuit section 3 is a negative bias voltage. Therefore, the high-frequency signal that is output from the high-frequency oscillator circuit section 2 is amplified and output to the high-frequency amplifier circuit section 3 and the detector circuit section 4 detects the negative voltage component from the high-frequency signal that is output in the high-frequency oscillator circuit section 2, and a negative output voltage that is detected is supplied to the bias circuit section 5, and a required appropriate negative bias voltage can be supplied to the high-frequency amplifier circuit section 3 by the bias circuit section 5.

Further, for example, it is possible to design having a high flexibility for downsizing of microwave-assisted magnetic recording system or the like in which energy-assisted recording is performed on a magnetic recording medium. Fundamentally, since large components such as a DC/DC converter that is required as a driving bias of the depression-type FET are not required, in a microwave-assisted magnetic recording system, the high-frequency amplifier of the embodiment can be installed in a magnetic head having a microwave generating element that generates a microwave field, and it is possible to efficiently supply the high-frequency signal.

(Second Embodiment)

In the embodiment, only a configuration different from that of the first embodiment described above is described. Particularly, the high-frequency signal that is oscillated in the high-frequency oscillator circuit section 2 is output to the side of the high-frequency amplifier circuit section 3 and the side of the detector circuit section 4 through the branch point between the high-frequency oscillator circuit section 2 and the high-frequency amplifier circuit section 3. If a load impedance on the side of the detector circuit section 4 is adapted to be an impedance that is higher than an input impedance of the high-frequency oscillator circuit section 2 in the branch point between the high-frequency oscillator circuit section 2 and the high-frequency amplifier circuit section 3, the voltage component of the high-frequency signal is efficiently detected on the side of the detector circuit section 4.

For example, in order to make the impedance on the side of the detector circuit section 4 from the branch point between the high-frequency oscillator circuit section 2 and the high-frequency amplifier circuit section 3 higher than the input impedance of the high-frequency oscillator circuit section 2, a high-frequency signal line to the side of the detector circuit section 4 is made to be thin with respect to a main high-frequency signal line flowing from the high-frequency oscillator circuit section 2 to the high-frequency amplifier circuit section 3. If the high-frequency signal line is thin, the load impedance on the side of the detector circuit section 4 is greater compared to the main high-frequency signal line flowing from the high-frequency oscillator circuit section 2 to the high-frequency amplifier circuit section 3 and is higher than the input impedance of the high-frequency oscillator circuit section 2 as viewed from the branch point. Particularly, the load impedance on the side of the detector circuit section 4 viewed from the branch point of the high-frequency oscillator circuit section 2 and the high-frequency amplifier circuit section 3 is impedance higher than, preferably 5 times the load impedance of the branch point. Since there is another method to make the detector circuit have impedance higher than the input impedance of the high-frequency oscillator circuit section 2, they are not specified in the embodiment.

According to the embodiment, since there is the configuration that the detector circuit section 4 is connected with the impedance on the side of the detector circuit section 4 from the branch point between the high-frequency oscillator circuit section 2 and the high-frequency amplifier circuit section 3 higher than the input impedance of the high-frequency oscillator circuit section 2, the high-frequency signal that is output from the high-frequency oscillator circuit section 2 easily detects only the voltage component when detecting in the detector circuit section 4. Thus, the high-frequency signal that is required for detection may be small and it is possible to reduce the ratio of the high-frequency signal that is input to the side of the detector circuit section 4 with respect to the high-frequency signal that is input to the high-frequency amplifier circuit section 3. Further, since the high-frequency signal is input to the high-frequency amplifier circuit section 3 while suppressing deterioration of the high-frequency signal, it is possible to suppress the deterioration of the characteristics and to achieve the high efficiency in the high-frequency amplifier circuit section 3.

(Third Embodiment)

Figure 2:
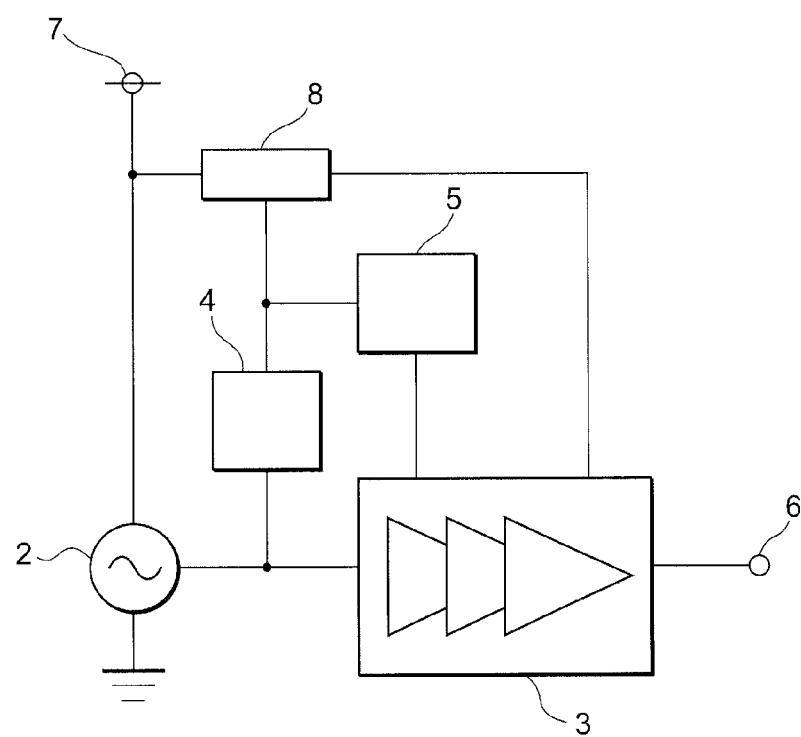
FIG. 2 is a block circuit diagram of a high-frequency amplifier according to a third embodiment.

In the embodiment, only a configuration different from that of the first embodiment described above is described. Particularly, as illustrated in FIG. 2, each of the high-frequency oscillator circuit section 2 and the high-frequency amplifier circuit section 3 is required to supply the voltage from a power supply voltage supply source of the outside to the power supply voltage supply terminal 7 and the voltage is supplied from the outside to the high-frequency amplifier circuit section 3 through an auxiliary circuit 8. Further, the auxiliary circuit 8 is connected so as to be controlled by a detection output voltage of the detector circuit section 4.

Next, if the voltage is supplied from the power supply voltage supply source of the outside to the power supply voltage supply terminal 7, the high-frequency oscillator circuit section 2 is driven and the high-frequency signal is output. The negative voltage is output from the detector circuit section 4 that detects the high-frequency signal as the detection output voltage, and the detection voltage that is output is applied to the side of the bias circuit section 5 and the side of the auxiliary circuit 8 as the negative voltage. If the negative voltage is applied to the auxiliary circuit 8, the auxiliary circuit 8 is operated and the voltage can be applied from the outside to the high-frequency amplifier circuit section 3. For example, the auxiliary circuit 8 may be a switching circuit so that the voltage is applied from the power supply voltage supply source of the outside to the high-frequency amplifier circuit section 3 after the detection voltage is applied.

Further, according to the embodiment, in the high-frequency oscillator circuit section 2 and the high-frequency amplifier circuit section 3, the voltage is supplied from the power supply voltage supply source of the outside to the power supply voltage supply terminal 7. The high-frequency amplifier circuit section 3 and the power supply voltage supply terminal 7 are connected through the auxiliary circuit 8 for changing timing for supplying the voltage. Further, since the auxiliary circuit 8 is connected so as to be controlled by the output voltage of the detector circuit section 4, if the voltage is supplied from the power supply voltage supply terminal 7 to the high-frequency oscillator circuit section 2 and the high-frequency amplifier circuit section 3, the high-frequency oscillator circuit section 2 is driven and the high-frequency signal is output and is detected in the detector circuit section 4. Next, in the bias circuit section 5, the negative bias voltage is supplied to the high-frequency amplifier circuit section 3 and the auxiliary circuit 8 is controlled by the detection voltage, and the voltage is supplied from the power supply voltage supply terminal 7 to the high-frequency amplifier circuit section 3. Further, if the detection voltage is not applied to the auxiliary circuit 8, the power supply voltage is not supplied from the power supply voltage supply terminal 7 to the high-frequency amplifier circuit section 3. Therefore, since the voltage is supplied from the power supply voltage supply terminal 7 to the high-frequency amplifier circuit section 3 only if the detection voltage is applied to the auxiliary circuit 8, unnecessary power consumption is eliminated in the high-frequency amplifier 1 and it is possible to achieve the high efficiency of the power consumption.

(Fourth Embodiment)

Figure 3:
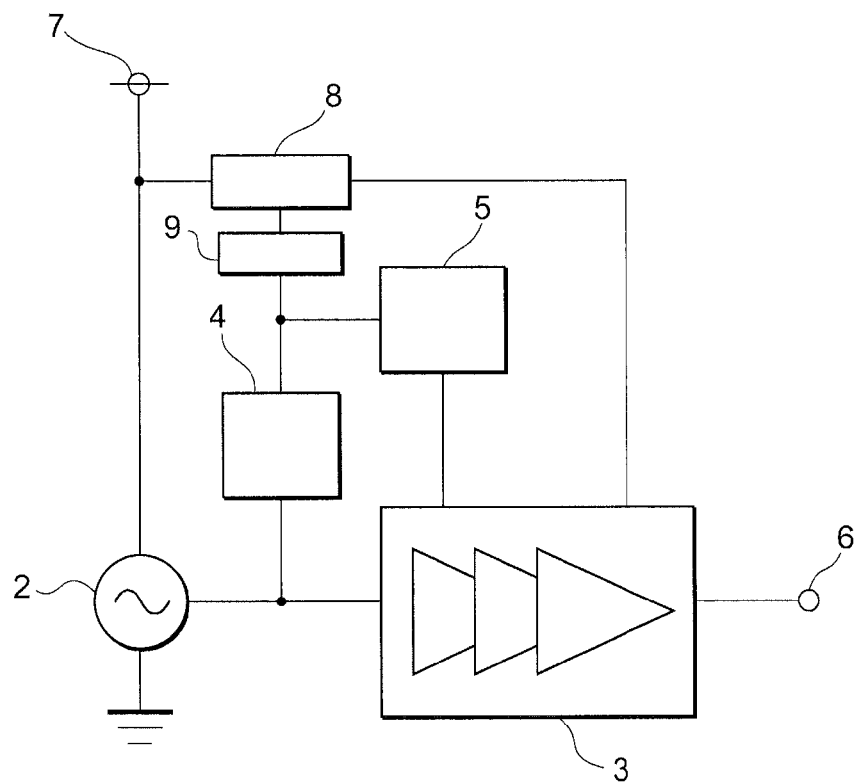
FIG. 3 is a block circuit diagram of a high-frequency amplifier according to a fourth embodiment.
Figure 4:
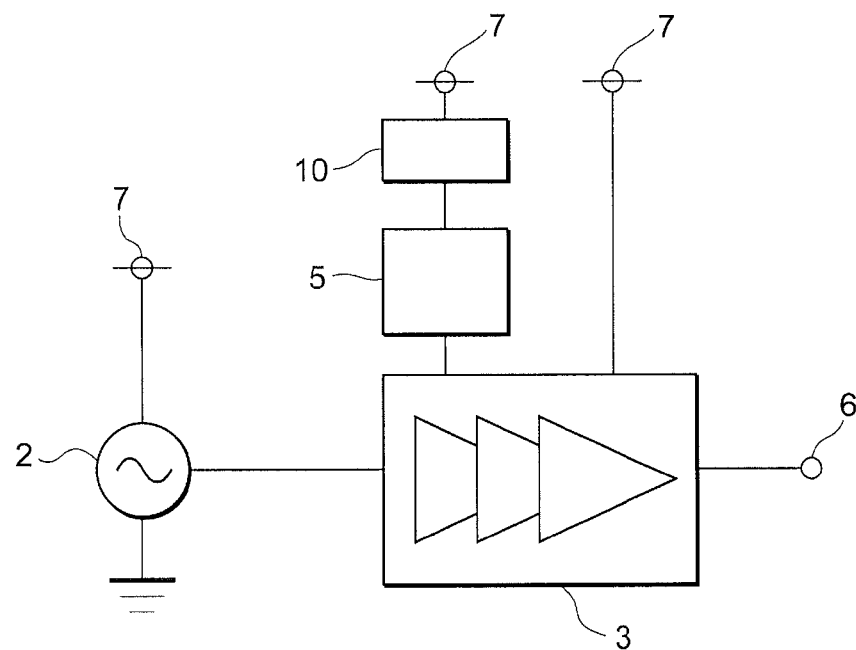
FIG. 4 is a schematic configuration view of related art.

In the embodiment, only a configuration different from that of the first embodiment described above is described. Particularly, as illustrated in FIG. 3, connection is performed between the branch point of the output side of the detector circuit section 4 and the bias circuit section 5 and the auxiliary circuit 8 through a delay circuit 9.

Moreover, the detection voltage that is output from the detector circuit section 4 is applied to the bias circuit section 5 and the auxiliary circuit 8, and the side of the auxiliary circuit 4 is connected through the delay circuit 9. Therefore, if the bias voltage is applied from the bias circuit section 5 to the gate of the high-frequency amplifier circuit section 3, at the same time or a delayed time, the voltage is applied from the power supply voltage supply terminal 7 to the high-frequency amplifier circuit section 3 through the auxiliary circuit 8.

According to the embodiment, since the configuration includes the delay circuit 9 between the detector circuit section 4 and the auxiliary circuit 8, if detection voltage is applied to the auxiliary circuit 8, the delay occurs. Thus, if the power supply voltage is supplied to the high-frequency amplifier circuit section 3 necessarily with the bias of the negative voltage, at the same time or after that, it is possible to supply the power supply voltage from the power supply voltage supply terminal 7 to the high-frequency amplifier circuit section 3. Therefore, since the power supply voltage is not supplied from the power supply voltage supply terminal 7 before the bias of the negative voltage is applied to the high-frequency amplifier circuit section 3, excessive current does not flow on the high-frequency amplifier circuit section 3 and it is possible to prevent the breakdown of the FET of the high-frequency amplifier circuit section 3.

As described above, for example, the high-frequency amplifier of a communication apparatus receiving the high-frequency signal, or the high-frequency amplifier installed in the magnetic head of the microwave-assisted magnetic recording system is related and, particularly, the high-frequency amplifier in which the negative bias voltage is required in the high-frequency amplifier section is adapted.

[Reference Signs List]
- 1 high-frequency amplifier
- 2 high-frequency oscillator circuit section
- 3 high-frequency amplifier circuit section
- 4 detector circuit section
- 5 bias circuit section
- 6 output terminal
- 7 power supply voltage supply terminal
- 8 auxiliary circuit
- 9 delay circuit
- 10 DC/DC converter

What is claimed is:

1. A high-frequency amplifier comprising:
   a high-frequency oscillator circuit section that generates a high-frequency signal;
   a high-frequency amplifier circuit section that amplifies and outputs the high-frequency signal;
   a bias circuit section that supplies a bias to the high-frequency amplifier circuit section; and
   a detector circuit section that detects the high-frequency signal which is output from the high-frequency oscillator circuit section between the high-frequency oscillator circuit section and the high-frequency amplifier circuit section, and inputs a voltage to the bias circuit section,
   wherein a negative voltage component of the high-frequency signal from the detector circuit section is detected, the detection voltage that is detected is supplied to the bias circuit section, and the bias voltage of the bias circuit section that is supplied to the high-frequency amplifier circuit section is a negative bias voltage;
   wherein the detector circuit section includes a detector circuit having an impedance higher than an input impedance of the high frequency amplifier circuit section; and
   wherein a voltage is supplied from a power supply voltage supply terminal to the high-frequency oscillator circuit section and the high-frequency amplifier circuit section, and the high-frequency amplifier circuit section and the power supply voltage supply terminal are connected through an auxiliary circuit for changing timing of supply of the voltage, and are connected so as to control the auxiliary circuit by an output voltage of the detector circuit section.

2. The high-frequency amplifier according to claim 1, further comprising: a delay circuit between the branch point of the detector circuit section and the bias circuit section, and the auxiliary circuit.

* * * * *